United States Patent [19]
Kajikawa et al.

[11] Patent Number: 5,841,156
[45] Date of Patent: Nov. 24, 1998

[54] SEMICONDUCTOR DEVICE INCLUDING Tl GAAS LAYER

[75] Inventors: Yasutomo Kajikawa; Zempei Kawazu, both of Tokyo, Japan

[73] Assignee: Mitsubishi Denki Kabushiki Kaisha, Tokyo, Japan

[21] Appl. No.: 861,582

[22] Filed: May 22, 1997

[30] Foreign Application Priority Data

Oct. 11, 1996 [JP] Japan .................................. 8-270118

[51] Int. Cl.⁶ ................. H01L 31/0328; H01L 31/0336; H01L 31/072; H01L 31/109
[52] U.S. Cl. .......................... 257/183; 257/184; 257/194; 257/197; 257/201
[58] Field of Search .................................. 257/183, 184, 257/187, 192, 194, 197, 198, 201, 200

[56] References Cited

U.S. PATENT DOCUMENTS 5,421,910  6/1995  Razeghi .................................. 148/33.4
5,483,088  1/1996  Chen et al. .............................. 257/189

FOREIGN PATENT DOCUMENTS 63-53914  3/1988  Japan .

OTHER PUBLICATIONS

Asahi et al., "New III–V Compound Semiconductor TlInGap For 0.9 μm To Over 10 μm Wavelength Range Laser Diodes And Their First Successful Growth", Japanese Journal of Applied Physics, vol. 35, Part 2, No. 7B, Jul. 1996, pp. L876–L879.

Maree et al., "Generation Of Misfit Dislocations In Semiconductors", Journal of Applied Physics, vol. 62, No. 11, Dec. 1987, pp. 4413–4420.

Schilfgaarde et al., "InTlP—A Proposed Infrared Detector Material", Applied Physics Letters, vol. 65, No. 21, Nov. 1994, pp. 2714–2716.

Nguyen et al., "Influence of Quantum–Well Width On Device Performance Of $Al_{0.30}Ga_{0.70}As/In_{0.25}Ga_{0.75}As$ (On GaAs) MODFET's", IEEE Transactions on Electron Devices, vol. 36, No. 5, May 1989, pp. 833–838.

Dickmann et al., "Delay Time Analysis On AlGaAs HFETs With Indium Mole Fraction Between 0% And 35%", Inst. Phys. Conf. Ser., No. 129, Chapter 9, 1992, pp. 723–728.

"Gas source MBE growth of TlInp", Extended Abstracts, (Spring Meeting, 1996); The Japan Society of Applied Physics, No. 26p–zc–10.

"1.06 μm laser diodes with strain–compensated barrier layers", Extended Abstracts (Autumn Meeting, 1995); The Japan Society of Applied Physics, No. 27a–ZA–7.

The Nature of the Chemical Bond, written by L. Pauling, Cornell University Press, 1960, p. 224.

"III–V Semiconductor Mixed Crystal", published by Corona Co., 1985, p. 71.

Primary Examiner—William Mintel
Attorney, Agent, or Firm—Leydig, Voit & Mayer

[57] ABSTRACT

A semiconductor device includes a GaAs substrate having a lattice constant; and a III-V mixed crystal semiconductor layer disposed on the GaAs substrate, containing Tl (thallium) and Ga (gallium) as Group III elements and As (arsenic) as a Group V element, and having a lattice constant larger than the lattice constant of the GaAs substrate. Therefore, the lattice mismatch of the III-V mixed crystal semiconductor layer with GaAs and the band gap energy of the III-V mixed crystal semiconductor layer are smaller than those of an InGaAs layer, resulting in a semiconductor device with improved operating characteristics and reliability.

4 Claims, 7 Drawing Sheets

SEMICONDUCTOR DEVICE INCLUDING T1 GAAS LAYER

FIELD OF THE INVENTION

The present invention relates to semiconductor devices and, more particularly, to a quantum well laser including a layer strained with respect to a substrate, a pseudomorphic high electron mobility transistor, and a heterojunction bipolar transistor.

BACKGROUND OF THE INVENTION

Although the lattice constant of InGaAs is larger than that of GaAs, it is possible to epitaxially grow a high quality InGaAs layer on a GaAs substrate by pseudomorphic growth, i.e., by compulsorily matching the lattice constant of the InGaAs layer in a direction parallel to the surface of the GaAs substrate with the lattice constant of the GaAs substrate, as long as the InGaAs layer is thinner than the critical thickness at which dislocations occur due to lattice mismatch. As described by P. M. J. Maree et al. in Journal of Applied Physics vol.62 (11), 1987, pp.4413–4420, the critical thickness at which lattice mismatch dislocations occur is given by $$f^2 t < \frac{b_p(1 - \nu/2)}{80\sqrt{3}\ (1 + \nu)} \left[ -\frac{1}{2} + \ln\left(\frac{4r_c}{b_0}\right) \right] \quad (1)$$

wherein t is the thickness of a Group III-V mixed crystal semiconductor layer, such as an InGaAs layer, f is the lattice mismatch of InGaAs to GaAs that is a material of the substrate, $\nu$ is Poisson's ratio, $b_O$ and $b_p$ are the magnitudes of Burgers vectors of a perfect dislocation and a partial dislocation, respectively, which satisfy the relationship, $b_O = \sqrt{3} \times b_p$, and $r_c$ is the radius of a half loop of dislocation, which is given by $$r_c = \frac{1}{(\sqrt{3}/2)\pi\tau b_0} \left[ \frac{\mu b_p^2(1 - \nu/2)}{2(1 - \nu)} \left(1 + \ln\frac{4r_c}{b_0}\right) + \pi d(\gamma + \tau b_p/2) \right]$$

wherein $\mu$ is the shear modulus, $\gamma$ is the energy of stacking faults per unit area, and d is the distance between a pair of dislocations, which is given by $$d = [\mu b_p^2(1-\nu/2)/4(1-\mu)][1/(\gamma+\tau b_p/2)]$$

Furthermore, $\tau$ is the shearing stress of a slip plane released due to generation of the half loop, which is given by $$\tau = \left[ \frac{2}{3} \sqrt{2}\ \mu(1 + \nu)/(1 - \nu) \right] f$$

For example, when general material constants of the Group III-V mixed crystal semiconductor layer, i.e., $b_O = 4.0$ angstroms, $\nu = 0.31$, $\mu = 3.2 \times 10^{11}$ erg/cm$^3$, $\gamma = 18$ erg/cm$^2$, are employed and the lattice mismatch f, i.e., the strain, is within a range from 0.01 to 0.05, equation (1) is approximately given by $$t \text{ (angstroms)} < 0.0116\ f^{-2.31}$$

Figure 10:
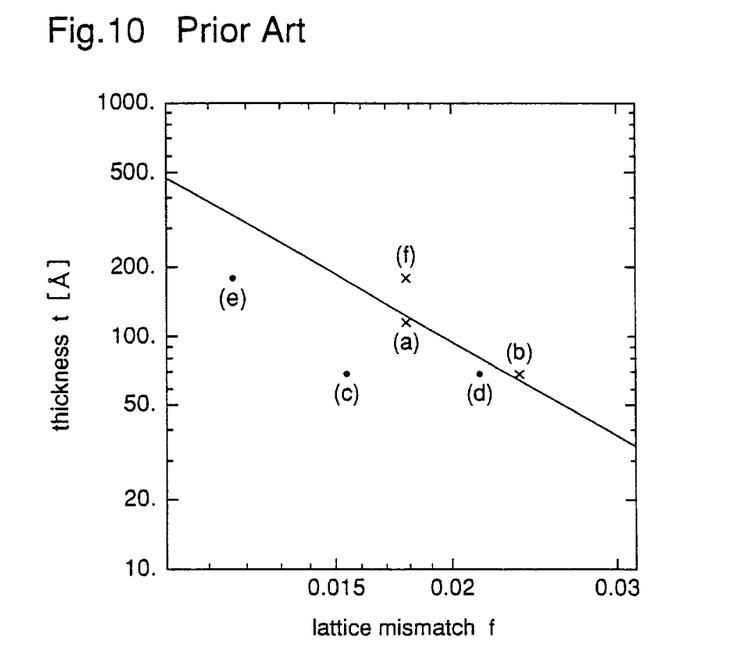
FIG. 10 is a diagram illustrating a critical thickness at which lattice mismatch dislocations occur, for a pseudomorphic semiconductor layer in a semiconductor device according to the prior art.

In FIG. 10, the critical thickness at which lattice mismatch dislocations occur, given by equation (1), is shown by the solid line for the relationship between the thickness t and the lattice mismatch f.

Using high quality strained InGaAs thin films grown on GaAs substrates under the condition that the thicknesses of the InGaAs films do not exceed the critical thickness at which lattice mismatch dislocations occur, various semiconductor devices have been developed effectively using the characteristics of InGaAs, i.e., band gap energy and an effective mass of electrons smaller than those of GaAs. For example, strained quantum well lasers, pseudomorphic high-electron-mobility transistors (hereinafter referred to as p-HEMTs), and heterojunction bipolar transistors (hereinafter referred to as HBTs) having strained base layers have been developed.

A strained quantum well laser employing a GaAs substrate and a strained InGaAs layer as a quantum well active layer holds an important position as a laser capable of oscillating in a wavelength range that is not realized by a conventional semiconductor laser employing an active layer comprising a material that lattice-matches with a semiconductor substrate. For example, employing a GaAs substrate and an InGaAs/AlGaAs strained quantum well active layer comprising, alternatingly laminated, InGaAs well layers and AlGaAs barrier layers, a semiconductor laser oscillating at a wavelength longer than 0.87 $\mu$m, for example, 0.98 $\mu$m, has already been realized whereas a conventional laser having a GaAs/AlGaAs quantum well active layer cannot oscillate at such a long wavelength. In addition, such a strained active layer improves operating characteristics of the laser, such as threshold current.

Figure 7:
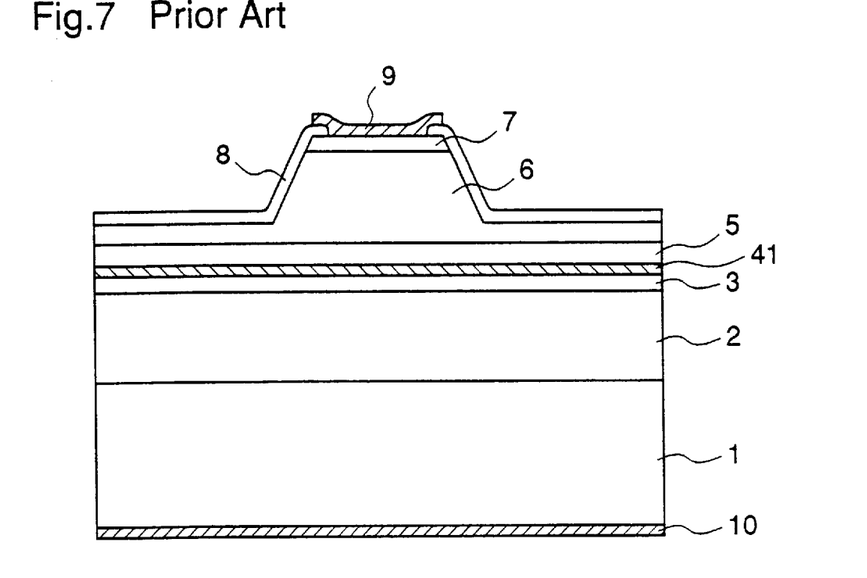
FIG. 7 is a cross-sectional view illustrating a strained quantum well laser according to the prior art.

FIG. 7 is a cross-sectional view illustrating a conventional strained quantum well laser. In the figure, reference numeral 1 designates an n type GaAs substrate. An n type $Al_{0.3}Ga_{0.7}As$ lower cladding layer 2, a lower undoped GaAs guide/barrier layer 3, an undoped $In_{0.23}Ga_{0.77}As$ quantum well layer 41, and an upper undoped GaAs guide/barrier layer 5 are successively disposed on the GaAs substrate 1. The lower guide/barrier layer 3, the quantum well layer 41, and the upper guide/barrier layer 5 constitute a quantum well active layer. A p type $Al_{0.3}Ga_{0.7}As$ upper cladding layer 6 having a ridge is disposed on the upper guide/barrier layer 5. A p type GaAs contact layer 7 is disposed on the ridge of the upper cladding layer 6. A surface ohmic electrode 9 is disposed on the contact layer 7, and a rear ohmic electrode 10 is disposed on the rear surface of the substrate 1. Reference numeral 8 designates an insulating film.

The semiconductor laser shown in FIG. 7 is fabricated by growing the respective semiconductor layers on the substrate 1, selectively etching the contact layer 7 and the upper cladding layer 6 using an insulating film or the like as a mask to form a ridge, and producing the electrodes 9 and 10 after covering the surface with the insulating film 8. The oscillating wavelength of this semiconductor laser is 1.02 $\mu$m.

In the InGaAs/AlGaAs strained quantum well laser so constructed, the effective band gap energy of the active layer can be reduced by increasing the In composition of the InGaAs strained quantum well layer 41 or by increasing the well width, i.e., the thickness of the well layer, whereby the oscillating wavelength range can be extended toward the longer wavelength side.

However, as described by Wada et al. in Extended Abstracts (Autumn Meeting, 1995); The Japan Society of Applied Physics, No. 27a-ZA-7, the lattice mismatch increases with an increase in the In composition, and dislocations easily occur due to the lattice mismatch, resulting in degradation of characteristics, such as threshold current density, and degradation of reliability with the passage of time. Also, an increase in the well width of the InGaAs quantum well layer leads to the same results as above. As a result, in the prior art semiconductor laser shown in FIG. 7, it is very difficult to realize an oscillation at a wavelength longer than 1.1 μm even though the composition or the thickness of the quantum well layer 41 is controlled.

On the other hand, in an InGaAs/AlGaAs p-HEMT wherein an InGaAs electron transit layer and an AlGaAs electron supply layer are laminated, for high speed and low noise operation, it is effective to increase the electron mobility in the InGaAs electron transit layer. The electron mobility increases with a reduction in the effective mass of electrons. In addition, as described by Haruo Nagai, Sadao Adachi, and Takashi Fukui in "III-V Semiconductor Mixed Crystal", published by Corona Co., 1985, p.71, generally the effective mass of an electron in a zinc-blende type compound semiconductor, such as InGaAs, decreases as the band gap energy decreases. In an InGaAs layer, the band gap energy decreases with an increase in the In composition, and the effective mass of electrons also decreases with an increase in the In composition, so that the electron mobility increases with an increase in the In composition as long as the scattering of electrons is uniform.

Figure 8:
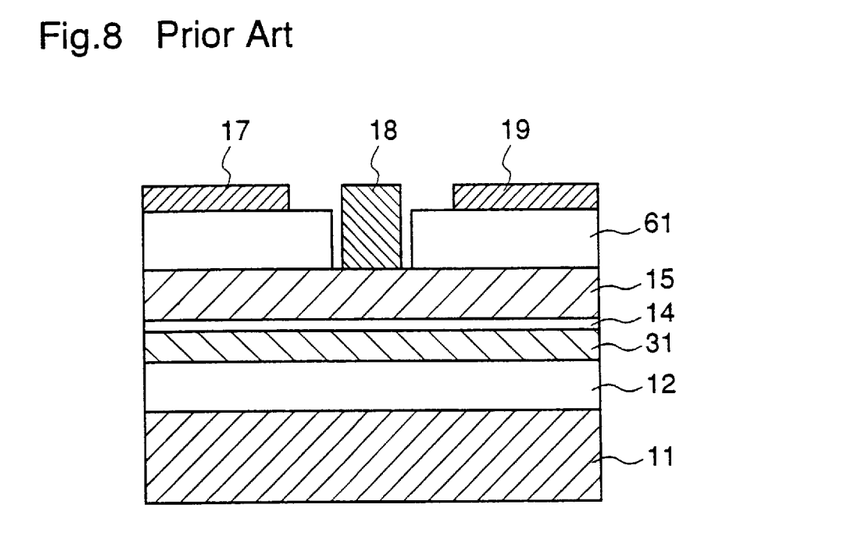
FIG. 8 is a cross-sectional view illustrating a p-HEMT according to the prior art.

FIG. 8 is a cross-sectional view illustrating a conventional p-HEMT. In FIG. 8, reference numeral 11 designates a semi-insulating GaAs substrate. An undoped GaAs buffer layer 12, an undoped $In_{0.26}Ga_{0.74}As$ electron transit layer 31, an undoped $Al_{0.25}Ga_{0.75}As$ spacer layer 14, and an n type $Al_{0.25}Ga_{0.75}As$ electron supply layer 15 are successively disposed on the substrate 11. A gate electrode 18 is disposed on the electron supply layer 15. High concentration n type (hereinafter referred to as n+ type) InGaAs contact layers 61 are disposed on the electron supply layer 15 at opposite sides of the gate electrode 18. A source electrode 17 and a drain electrode 19 are disposed on the respective contact layers 61.

In this p-HEMT, a two-dimensional electron gas layer is produced in an upper portion of the electron transit layer 31 as a result of movement of electrons, which are generated from a donor impurity in the electron supply layer 15, toward the electron transit layer 31, and electrons move in the two-dimensional electron gas layer at a high electron mobility. The electron density in the two-dimensional electron gas layer is controlled by applying a gate voltage to control the current flow between the source electrode 17 and the drain electrode 19. This p-HEMT is fabricated by the process steps of successively growing the above-mentioned semiconductor layers on the GaAs substrate 11; forming the source electrode 17 and the drain electrode 19 on the contact layer 15 so that these electrodes make ohmic contact to the contact layer 61; forming an aperture in the contact layer 61 so that it reaches the electron supply layer 15 under the contact layer 61; and forming the gate electrode 18 on the electron supply layer 15 exposed at the bottom of the aperture so that it makes Schottky contact with the electron supply layer 15.

In the p-HEMT with the InGaAs electron transit layer 31, the electron mobility increases with a decrease in the band gap energy of the electron transit layer 31. However, as described by J. Dickmann et al. in "Delay time analysis on AlGaAs/InGaAs HFETs with indium mole fraction between 0% and 35%", Institute of Physics Conference Series No.129, 1992, pp.723–728, when the band gap energy of the InGaAs electron transit layer increases with an increase in the In composition while keeping the thickness of the electron transit layer constant, the lattice mismatch between the electron transit layer and the GaAs substrate increases, resulting in lattice mismatch dislocations. The lattice mismatch dislocations increase the scattering of electrons, whereby the electron mobility decreases, resulting in degradation of high-frequency characteristics of the p-HEMT.

Further, with an increase in the In composition, the alloy ratio increases, whereby the electrons are subjected to alloy scattering, resulting in a reduction in the electron mobility. Although, the InGaAs electron transit layer 31 must be about 12 nm thick to obtain a sufficient sheet electron density, it is impossible for the prior art p-HEMT to increase the band gap energy of the InGaAs electron transit layer 31 by making the In composition larger than 0.27 while maintaining this thickness.

Furthermore, in order to realize high-power output operation of the p-HEMT, it is effective to increase the sheet electron density by increasing the thickness of the InGaAs electron transit layer 31. However, as described by L. D. Nguyen et al. in "Influence of Quantum-Well Width on Device Performance of $Al_{0.30}Ga_{0.70}As/In_{0.25}Ga_{0.75}As$ (on GaAs) MODFET's", IEEE TRANSACTIONS ON ELECTRON DEVICES, Vol.36, No. 5, May 1989, when the thickness of the InGaAs electron transit layer 31 is increased while keeping the In composition constant, the critical thickness at which lattice mismatch dislocations occur is exceeded, and lattice mismatch dislocations, which degrade high-frequency characteristics of the P-HEMT occur. As a result, in this prior art p-HEMT, the InGaAs electron transit layer 31 cannot be thicker than 12 nm while maintaining the In composition sufficient to obtain a desired band gap energy. For example, in FIG. 10, point (a) shows InGaAs having a thickness of 12 nm and an In composition of 0.25 (f=0.018), and this point (a) is in the vicinity of the critical point at which lattice mismatch dislocations occur.

Further, in a semiconductor device comprising semiconductor layers on a GaAs substrate, such as the prior art p-HEMT, in order to reduce the contact resistance of the ohmic electrode, an InGaAs layer having a relatively low band gap energy is used as the contact layer. Also in the prior art p-HEMT mentioned above, the contact layer 61 comprises $n^+$ type $In_{0.5}Ga_{0.5}As$ In this case, it is not necessary to use a high quality crystalline layer as the contact layer itself. So, InGaAs having a relatively large In composition, i.e., $In_{0.5}Ga_{0.5}As$, is employed although it causes lattice mismatch dislocations. However, when the In composition of the contact layer exceeds 0.5, the lattice mismatch becomes too large, resulting in considerable unevenness at the epitaxially grown surface, which unevenness adversely affects the subsequent wafer process. Therefore, it is difficult to sufficiently reduce the band gap energy of the contact layer by increasing the In composition.

Furthermore, in an HBT having a GaAs/InGaAs structure, i.e., laminated AlGaAs emitter and InGaAs base layers, on a GaAs substrate, in order to increase the operating speed, it is effective to reduce the base transit time is. In order to reduce the base transit time, a an electric field for drifting of minority carriers is produced in the base layer.

Figure 9:
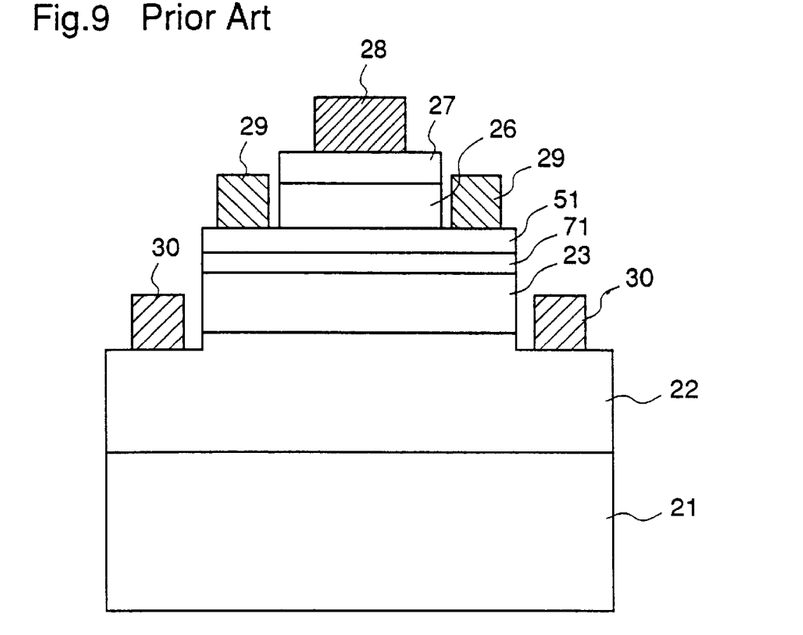
FIG. 9 is a cross-sectional view illustrating an HBT according to the present invention.

FIG. 9 is a cross-sectional view illustrating a prior art HBT. In FIG. 9, reference numeral 21 designates a semi-insulating GaAs substrate. An $n^+$ type GaAs collector contact layer 22 is disposed on the GaAs substrate 21. An n type GaAs first collector layer 23 is disposed on a center portion of the collector contact layer 22. Collector electrodes 30 are disposed on the collector contact layer 22 at both sides of the first collector layer 23. An n type $In_xGa_{1-x}As$ second collector layer 71 is disposed on the first collector layer 23. In the second collector layer 71, the In composition x is 0 at the interface with the collector contact layer 22 and increases to 0.2. A p type $In_xGa_{1-x}As$ base layer 51 is disposed on the second collector layer 71. In the base layer 51, the In composition x is 0.2 at the interface with the second collector layer 71 and decreases upward to 0. An n type Al$_{0.3}$Ga$_{0.7}$As emitter layer 26 is disposed on a center portion of the base layer 51. Base electrodes 29 are disposed on the base layer 51 at opposite sides of the emitter layer 26. An n$^+$ type GaAs emitter contact layer 27 is disposed on the emitter layer 26. An emitter electrode 28 is disposed on the emitter contact layer 27. The HBT so constructed is fabricated by successively growing the respective semiconductor layers on the GaAs substrate and producing the respective electrodes.

In the prior art HBT, to reduce the base transit time, the In composition of the p type In$_x$Ga$_{1-x}$As base layer 51 on the emitter side is 0 and gradually increases in approaching closer to the collector layer 71, whereby the potential of the base layer is graded to produce a an electric field. In the HBT so constructed, with an increase in the potential gradient in the base layer 51, the electron velocity is increased and the base transit time is reduced. In order to steepen the potential gradient, the In composition of the InGaAs base layer 51 on the collector side should be increased. However, if the In composition becomes too large, the lattice mismatch increases, resulting in lattice mismatch dislocations that degrade characteristics. Hence, it is very difficult to reduce the base transit time.

SUMMARY OF THE INVENTION

It is an object of the present invention to provide a semiconductor device using a GaAs substrate and including a strained semiconductor layer that can provide a smaller lattice mismatch with the GaAs substrate and a lower band gap energy than those of an InGaAs layer.

It is another object of the present invention to provide a semiconductor device using a GaAs substrate, that can reduce the effective band gap energy of an active layer.

It is still another object of the present invention to provide a semiconductor device using a GaAs substrate, that can reduce the alloy ratio, the band gap energy, and the electron effective mass in an electron transit layer, without degrading characteristics and reliability.

It is yet another object of the present invention to provide a semiconductor device using a GaAs substrate, that can increase the potential gradient of a base layer without degrading characteristics and reliability.

It is a further object of the present invention to provide a semiconductor device using a GaAs substrate, and that can reduce the band gap energy of a contact layer without roughing the surface of the contact layer.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device comprises a GaAs substrate having a lattice constant; and a Group III-V mixed crystal semiconductor layer disposed on the GaAs substrate, containing Tl (thallium) and Ga (gallium) as Group III elements and As (arsenic) as a Group V element, and having a lattice constant larger than the lattice constant of the GaAs substrate. Therefore, the lattice mismatch of the Group III-V mixed crystal semiconductor layer with GaAs and the band gap energy of the semiconductor layer are made smaller than those of an InGaAs layer, resulting in a semiconductor device with improved operating characteristics and reliability.

According to a second aspect of the present invention, the above-mentioned semiconductor device comprises the GaAs substrate having a first conductivity type; the III-V mixed crystal semiconductor layer having a lattice constant that makes pseudomorphic lattice match with GaAs, and serving as an active layer; a first conductivity type lower cladding layer disposed on the GaAs substrate; an upper cladding layer of a second conductivity type, opposite the first conductivity type, disposed on the lower cladding layer with the active layer intervening; and a second conductivity type contact layer disposed on the upper cladding layer. Therefore, the lattice mismatch of the Group III-V mixed crystal semiconductor layer with GaAs is reduced, providing a semiconductor device with improved characteristics. Further, the effective band gap energy of the active layer is reduced by reducing the band gap energy of the Group III-V mixed crystal semiconductor layer in the active layer, providing a semiconductor device with improved characteristics.

According to a third aspect of the present invention, the above-mentioned semiconductor device comprises the GaAs substrate having semi-insulating property; the III-V mixed crystal semiconductor layer having a lattice constant that makes pseudomorphic lattice match with GaAs, and serving as an electron transit layer; a first conductivity type electron supply layer disposed on the electron transit layer; a first conductivity type contact layer disposed on the electron supply layer and having a thickness, the contact layer having an opening having a depth larger than the thickness of the contact layer; a source electrode and a drain electrode disposed on the contact layer at both sides of the opening; and a gate electrode disposed on the electron supply layer through the opening. Therefore, in the electron transit layer, the alloy ratio, the lattice mismatch with GaAs, and the band gap energy are reduced as compared with a conventional InGaAs electron transit layer, whereby the alloy ratio, the effective mass of electron, and the sheet electron density in the electron transit layer are improved without degrading characteristics and reliability, providing a high performance semiconductor device.

According to a fourth aspect of the present invention, the above-mentioned semiconductor device comprises the GaAs substrate having semi-insulating property; the III-V mixed crystal semiconductor layer having a lattice constant that makes pseudomorphic lattice match with GaAs, having a Tl composition ratio that increases with distance from the substrate until reaching a prescribed value, and serving as a second collector layer; a first collector layer disposed on the GaAs substrate; a III-V mixed crystal semiconductor base layer disposed on the first collector layer with the second collector layer intervening, the base layer containing As as a Group V element and Ga and Tl as Group III elements, having a Tl composition ratio that decreases from the value of the second collector layer with distance from the second collector layer, and having a lattice constant that is larger than the lattice constant of GaAs and makes pseudomorphic lattice match with GaAs; and an emitter layer disposed on the base layer. Therefore, the potential gradient of the base layer is increased without degrading characteristics and reliability, whereby the electron velocity is increased to reduce the base transit time, resulting in a high performance semiconductor device.

According to a fifth aspect of the present invention, the above-mentioned semiconductor device comprises the GaAs substrate having semi-insulating property; the III-V mixed crystal semiconductor layer having a lattice constant that makes pseudomorphic lattice match with GaAs, having a Tl composition ratio that increases with distance from the substrate until reaching a prescribed value, and serving as a base layer; an emitter layer disposed on the GaAs substrate; a III-V mixed crystal semiconductor second collector layer disposed on the emitter layer with the base layer intervening, the second collector layer containing As as a Group V element and Ga and Tl as Group III elements, having a Tl composition ratio that decreases from the value of the base layer with distance from the base layer, and having a lattice constant that is larger than the lattice constant of GaAs and makes pseudomorphic lattice match with GaAs; and a first collector layer disposed on the second collector layer. Therefore, the potential gradient of the base layer is increased without degrading characteristics and reliability, whereby the electron velocity is increased to reduce the base transit time, resulting in a high performance semiconductor device.

According to a sixth aspect of the present invention, in the above-mentioned semiconductor device, the III-V mixed crystal semiconductor layer serves as a contact layer. Therefore, the band gap energy of the contact layer is reduced while keeping the lattice mismatch with the GaAs substrate reduced, without roughing the surface of the contact layer, resulting in a high performance semiconductor device.

According to a seventh aspect of the present invention, in the above-mentioned semiconductor device, the Group III-V mixed crystal semiconductor layer is thinner than a critical thickness at which dislocations occur due to lattice mismatch. Therefore, a semiconductor device with improved operating characteristics and reliability is realized.

According to an eighth aspect of the present invention, in the above-mentioned semiconductor device, the Group III-V mixed crystal semiconductor layer is a TlGaAs layer. Therefore, a semiconductor device with improved operating characteristics and reliability is realized.

DETAILED DESCRIPTION OF THE PREFERRED EMBODIMENTS

Embodiment 1

Figure 1:
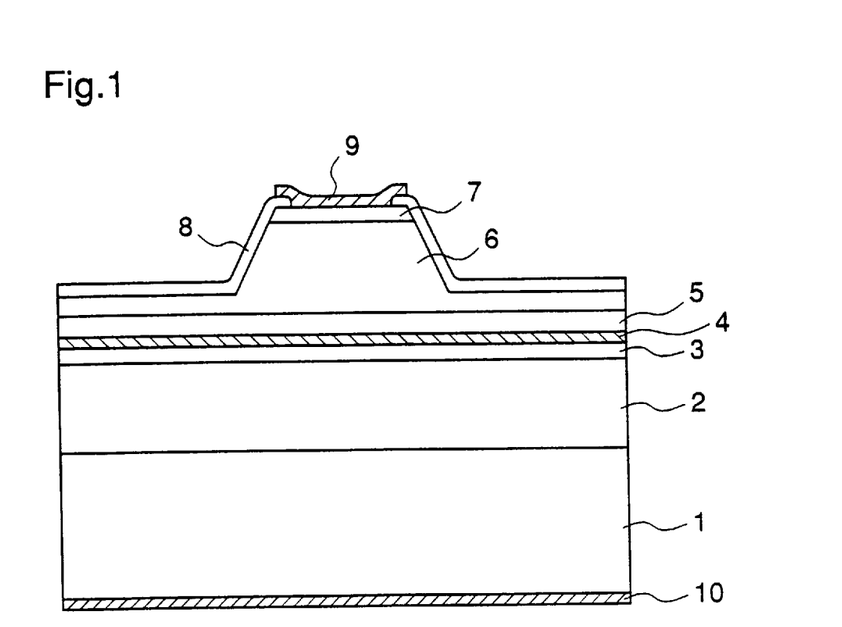
FIG. 1 is a cross-sectional view illustrating a strained quantum well laser according to a first embodiment of the present invention.

FIG. 1 is a cross-sectional view illustrating a strained quantum well laser employing a GaAs substrate, according to a first embodiment of the present invention. In this first embodiment of the invention, a TlGaAs layer is used as a strained quantum well layer included in an active layer, providing a strained quantum well laser having an oscillating wavelength longer than that of the prior art semiconductor laser.

In FIG. 1, reference numeral 1 designates an n type GaAs substrate. An n type $Al_{0.3}Ga_{0.7}As$ lower cladding layer 2 having a thickness of about 3 $\mu$m and an n type dopant concentration of about $4\times10^{17}$ cm$^{-3}$ is disposed on the substrate 1. An undoped GaAs lower guide/barrier layer 3 having a thickness of about 24 nm is disposed on the lower cladding layer 2. An undoped $Tl_{0.23}Ga_{0.77}As$ quantum well layer 4 having a thickness of about 7 nm is disposed on the lower guide/barrier layer 3. The quantum well layer is thinner than the critical thickness and pseudomorphically lattice-matches with the substrate and the cladding layer. An undoped GaAs upper guide/barrier layer 5 having a thickness of about 24 nm is disposed on the quantum well layer 4. A p type $Al_{0.3}Ga_{0.7}As$ upper cladding layer 6 having a p type dopant concentration of about $2\times10^{18}$ cm$^{-3}$ and a thickness of about 3 $\mu$m is disposed on the upper guide/barrier layer 5. The upper cladding layer 6 has a ridge in the center of the structure, and a p type GaAs contact layer 7 is disposed on the top of the ridge. A surface ohmic electrode 9 is disposed on the contact layer 7, and a rear ohmic electrode 10 is disposed on the rear surface of the substrate 1. Reference numeral 8 designates an insulating film, such as SiN or $SiO_2$.

A description is given of the fabrication process.

Initially, on the n type GaAs substrate 1, the n type $Al_{0.3}Ga_{0.7}As$ lower cladding layer 2, the undoped GaAs lower guide/barrier layer 3, the undoped $Tl_{0.23}Ga_{0.77}As$ quantum well layer 4, the undoped GaAs upper guide/barrier layer 5, the p type $Al_{0.3}Ga_{0.7}As$ upper cladding layer 6, and the p type GaAs contact layer 7 are successively epitaxially grown. Thereafter, using a mask (not shown) comprising an insulating film, the contact layer 7 and the upper cladding layer 6 are selectively etched to produce a ridge structure. After removal of the mask, the insulating film 8 is formed, and the surface ohmic electrode 9 and the rear ohmic electrode 10 are produced on the contact layer 7 and the rear surface of the substrate 1, respectively.

In the strained quantum well laser so fabricated, the effective band gap energy of the active layer is reduced by changing the composition of the strained quantum well layer to reduce the band gap energy or by increasing the well width, i.e., the thickness of the well layer, whereby the oscillating wavelength range of the laser is extended toward the longer wavelength side.

According to "The Nature of The Chemical Bond" written by L. Pauling, Cornell University Press (1960), p.224, the covalent radius of Tl (thallium) is only 2% larger than that of In. So, in InAs or InP, when In is replaced with Tl, it is expected that the lattice constant increases by only 1% or so. Further, since Tl is larger than In in atomic number, when In in InAs or InP is replaced with Tl, a reduction in the band gap energy of this material is expected.

In Applied Physics Letters, vol.65 (1994), pp.2714 to 2716, M. van Schilfgaarde et al. execute theoretical calculations on compound semiconductor materials containing Tl, and estimate that the lattice constant of TlP (5.96 angstroms) and the lattice constant of TlAs (6.18 angstrom) are different by only 1.5% and 2% from the lattice constant of InP (5.87 angstroms) and the lattice constant of InAs (6.06 angstrom), respectively. Further, they estimate by calculation that TlP and TlAs are semimetals having negative band gap energies of −0.27 eV and −1.34 eV, respectively. On the basis of the results of calculation, they propose $In_{0.33}Tl_{0.67}P$ grown on an InP substrate and $In_{0.15}Tl_{0.85}As$ grown on an InAs substrate as parts of infrared detectors, in place of $Hg_{0.78}Cd_{0.22}Te$. That is, according to the calculation, these mixed crystals, $In_{0.33}Tl_{0.67}P$ and $In_{0.15}Tl_{0.85}As$, have identical band gap energies, 0.1 eV, and the lattice mismatch degrees between these mixed crystals and the substrates are only 0.5% and 0.3%, respectively. So, they conclude that $In_{0.33}Ta_{0.67}P$ and $In_{0.15}Ta_{0.85}As$ can be grown on an InP substrate and an InAs substrate, respectively.

In fact, as described by Yamamoto et al. in Extended Abstracts (spring Meeting, 1996); The Japan Society of Applied Physics, No. 26p-ZC-10, TlInP has been grown on an InP substrate. Further, Yamamoto et al. propose TlInGaP that perfectly lattice-matches with InP, as a material of a laser oscillating at a wavelength longer than 1 μm, in place of conventional InGaAsP. An advantage of TlInGaP over InGaAsP is that it includes only one Group V element.

However, among materials that pseudomorphically lattice-match with InP, only AlInAs has the highest band gap energy applicable to a cladding layer of a semiconductor laser, but the band gap energy of AlInAs is only 1.47 eV. Hence, when overflow of carriers due to high temperature operation or high carrier injection is considered, even TlInGaP grown on InP has a practical problem as a material of a laser oscillating at a wavelength shorter than 1.2 μm.

On the other hand, in the strained quantum well laser according to the first embodiment of the invention, as the quantum well layer in the active layer, TlGaAs having a Tl composition at which lattice mismatch dislocations do not occur is grown on the GaAs substrate. That is, since the GaAs substrate is used, AlGaAs or AlGaInP having a band gap energy sufficiently larger than that of the active layer can be used as the cladding layer, so that the overflow of carriers due to high temperature operation or high carrier injection is negligible.

Furthermore, assuming that the active layer includes a 7 nm thick quantum well layer and the oscillating wavelength is 1070 nm, when the quantum well layer comprises InGaAs, the In composition of the InGaAs layer is 0.33, and the lattice mismatch with the GaAs substrate is 2.4% that, exceeding the critical value at which lattice mismatch dislocations occur, whereby laser characteristics, such as threshold current, are degraded. In FIG. 10, point (b) shows the 7 nm thick InGaAs layer having an In composition of 0.33 (f=0.024). In contrast to the InGaAs layer, when a 7 nm thick TlGaAs layer is used as the quantum well layer in the active layer, since the Tl composition of the TlGaAs layer is 0.165, the lattice mismatch with the GaAs substrate is only 1.5%, and no lattice mismatch dislocations occur, resulting in a semiconductor laser with good characteristics. In FIG. 10, point (c) shows the 7 nm thick TlGaAs layer having the Tl composition of 0.165 (f=0.015).

Furthermore, when the Tl composition is increased, the effective band gap energy of the active layer is reduced, whereby a long wavelength laser is realized. Although it is very difficult for the prior art semiconductor laser to oscillate at a wavelength longer than 1.1 μm, in this first embodiment a semiconductor laser oscillating at a wavelength longer than 1.1 μm is easily realized by further increasing the Tl composition.

In the strained quantum well laser shown in FIG. 1, the lattice mismatch of the TlGaAs quantum well layer 4 is about 1.6%, and the band gap energy is about 1.11 eV. In FIG. 10, point (d) shows a 7 nm thick $Tl_{0.23}Ga_{0.77}As$ layer (f=0.016) used as the quantum well layer 4, and no lattice mismatch dislocation occurs at point (d). Therefore, in this first embodiment, a semiconductor laser oscillating at a wavelength of 1.12 μm is realized whereas such a long wavelength oscillation is not achieved in the prior art semiconductor laser using an InGaAs quantum well layer.

As described above, since the semiconductor laser according to the first embodiment employs a GaAs substrate and an active layer including a TlGaAs quantum well layer, a semiconductor laser oscillating at a wavelength longer than 1.1 μm is realized.

Embodiment 2

Figure 2:
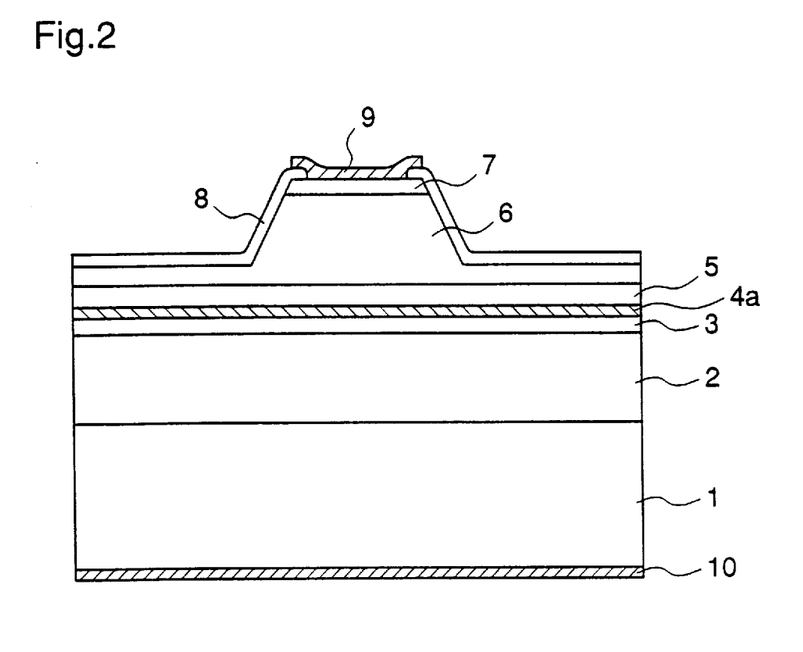
FIG. 2 is a cross-sectional view illustrating a strained quantum well laser according to a second embodiment of the present invention.

FIG. 2 is a cross-sectional view illustrating a strained quantum well laser employing a GaAs substrate, according to a second embodiment of the present invention. In this semiconductor laser, a TlGaAs layer is used as a strained quantum well layer in an active layer, and the Tl composition of the quantum well layer is controlled so that the band gap energy of the quantum well layer becomes equal to the band gap energy of the quantum well layer of the active layer in the prior art semiconductor laser, whereby the lattice mismatch of the quantum well layer with the GaAs substrate is reduced as compared with the prior art semiconductor laser. In FIG. 2, the same reference numerals as those shown in FIG. 1 designate the same or corresponding parts. Reference numeral 4a designates an undoped $Tl_{0.115}Ga_{0.885}As$ quantum well layer about 7 nm thick. The strained quantum well laser shown in FIG. 1 is fabricated in process steps similar to those mentioned for the strained quantum well laser shown in FIG. 1.

For a laser having an oscillating wavelength of 1.02 μm, the lattice mismatch is compared between the InGaAs quantum well layer in the prior art strained quantum well laser and the TlGaAs quantum well layer in the strained quantum well laser according to this second embodiment. When the barrier layer comprises GaAs and the quantum well layer is about 8 nm thick, in the InGaAs quantum well layer, the In composition is 0.23 and the lattice mismatch with the GaAs substrate is 1.6%. On the other hand, in the TlGaAs quantum well layer, the Tl composition is 0.115 and the lattice mismatch with the GaAs substrate is only 0.8%. Therefore, to obtain the same oscillating wavelength, the lattice mismatch can be reduced by using the TlGaAs quantum well layer in place of the InGaAs quantum well layer. Generally, the larger the lattice mismatch is, the more the lattice mismatch dislocations occur when the device is used for long hours. Therefore, when TlGaAs is employed as a material of the quantum well layer, an undesired reduction in the reliability of the device with the passage of time is avoided.

For example, in the strained quantum well laser shown in FIG. 2, which oscillates at a wavelength of 1.02 μm, the lattice mismatch is significantly reduced as compared with the prior art semiconductor laser having the same oscillating wavelength, whereby the reliability of the 1.02 μm laser is improved.

In the first and second embodiments of the invention, emphasis has been placed upon strained quantum well lasers including a single TlGaAs quantum well layer. However, a strained quantum well laser including a multiquantum well active layer in which TlGaAs quantum well layers and barrier layers are alternatingly laminated is within the scope of the invention.

Further, in the first and second embodiments, emphasis has been placed upon strained quantum well lasers.

However, optical semiconductor devices, such as optical modulators and optical amplifiers, having structures similar to the strained quantum well lasers desired above, are also within the scope of the invention.

Furthermore, in the first and second embodiments, emphasis has been placed upon strained quantum well lasers including TlGaAs quantum well layers. However, a strained quantum well laser including a Group III-V mixed crystal semiconductor layer that contains Tl and Ga as Group III elements and As as a Group V element, has a lattice constant larger than that of GaAs, and pseudomorphically lattice-matches with GaAs, such as a zinc-blende type III-V mixed crystal semiconductor layer, is also within the scope of the invention. For example, a strained $Al_{x1}Ga_{x2}In_{x3}Tl_{x4}As_yP_{1-y}$ (x1+x2+x3+x4=1, $0 \leq x1 < 1$, $0 < x2 < 1$, $0 \leq x3 < 1$, $0 < x4 < 1$, $0 < y \leq 1$) layer may be used as a quantum well layer with the same effects as mentioned above. However, the III-V mixed crystal semiconductor layer must be thinner than the critical thickness at which lattice mismatch dislocations occur. That is, the thickness t of the III-V mixed crystal semiconductor layer and the lattice mismatch f with GaAs must be selected to satisfy the following relationship.

$$f^2 t < \frac{b_p(1-v/2)}{80\sqrt{3}\ (1+v)} \left[ -\frac{1}{2} + \ln\left(\frac{4r_c}{b_0}\right) \right]$$

wherein v is Poisson's ratio, $b_O$ and $b_p$ are the magnitudes of Burgers vectors of a perfect dislocation and a partial dislocation, respectively, which satisfy the relationship, $b_O = \sqrt{3} \times b_p$, and $r_c$ is the radius of a half loop of dislocation, which is given by $$r_c = \frac{1}{(\sqrt{3}/2)\pi\tau b_0} \left[ \frac{\mu b_p^2(1-v/2)}{2(1-v)} \left(1 + \ln\frac{4r_c}{b_0}\right) + \pi d(\gamma + \tau b_p/2) \right]$$

Further, $\mu$ is the shear modulus, $\gamma$ is the energy of stacking fault per a unit area, and d is the distance between a pair of partial dislocations, which is given by $$d = [\mu b_p^2(1-v/2)4(1-v)][1/(\gamma+\tau b_p/2)]$$

Furthermore, $\tau$ is the shearing stress of a slip plane released due to generation of the half loop, which is given by $$\tau = \left[\frac{2}{3}\ \sqrt{2}\ \mu(1+v)/(1-v)\right] f$$

Further, when only As is used as a Group V element of the III-V mixed crystal semiconductor layer, the manufacturing apparatus is simplified and control during the manufacturing process is facilitated, as compared with the case where both As and P are used.

Embodiment 3

Figure 3:
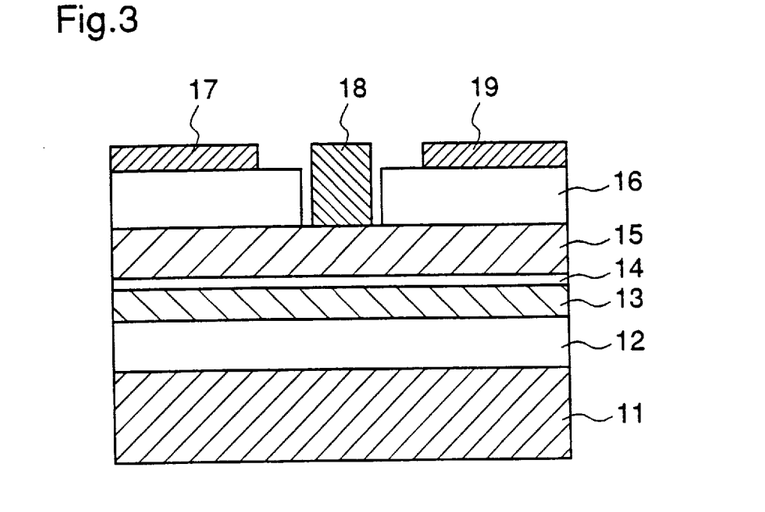
FIG. 3 is a cross-sectional view illustrating a p-HEMT according to a third embodiment of the present invention.

FIG. 3 is a cross-sectional view illustrating a pseudomorphic high-electron-mobility transistor (hereinafter referred to as a p-HEMT) employing a GaAs substrate, according to a third embodiment of the present invention. In this p-HEMT, a strained TlGaAs layer is used as an electron transit layer, and the Tl composition of the TlGaAs electron transit layer is made smaller than the In composition of the InGaAs electron transit layer used in the prior art p-HEMT, which InGaAs electron transit layer has a band gap energy equal to that of the TlGaAs electron transit layer. In FIG. 3, reference numeral 11 designates a semi-insulating GaAs substrate. An undoped GaAs buffer layer 12 about 500 nm thick is disposed on the GaAs substrate 11. An undoped $Tl_{0.13}Ga_{0.87}As$ electron transit layer 13 about 12 nm thick is disposed on the buffer layer 12. An undoped $Al_{0.25}Ga_{0.75}As$ spacer layer 14 about 3 nm thick is disposed on the electron transit layer 13. An n type $Al_{0.25}Ga_{0.75}As$ electron supply layer 15 about 40 nm thick and having a dopant concentration of $2 \times 10^{18}$ cm$^{-3}$ is disposed on the spacer layer 14. A gate electrode 18 is disposed on a center portion of the electron supply layer 15. n+ type $Tl_{0.4}Ga_{0.6}As$ contact layers 16 about 30 nm thick are disposed on the electron supply layer 15 at both sides of the gate electrode 18. A source electrode 17 and a drain electrode 19 are disposed on the respective contact layers. The source electrode 17 and the drain electrode 19 comprise a material which makes ohmic contact with the contact layers 16.

In this p-HEMT, electrons move at a high mobility through a two-dimensional electron gas layer which is produced in an upper region of the electron transit layer 13 as a result of movement of electrons generated from the donor impurity in the electron supply layer 15 toward the electron transit layer 13, and the electron density in the two-dimensional electron gas layer is controlled by a gate voltage to change current flowing through the two-dimensional electron gas layer between the source electrode 17 and the drain electrode 19. The fabrication process of the p-HEMT comprises the steps of epitaxially growing the undoped GaAs buffer layer 12, the undoped $Tl_{0.13}Ga_{0.87}As$ electron transit layer 13, the undoped $Al_{0.25}Ga_{0.75}As$ spacer layer 14, the n type $Al_{0.25}Ga_{0.75}As$ electron supply layer 15, and the n+ type $Tl_{0.4}Ga_{0.6}As$ contact layer 16 successively on the GaAs substrate 11, producing the source and drain electrodes 17 and 19 on the contact layer 16, forming an opening in the contact layer 16 to expose a portion of the electron supply layer 15, and producing the gate electrode 18 on the exposed electron supply layer 15 through the opening of the contact layer 16 so that the gate electrode makes a Schottky contact with the electron supply layer 15.

In the p-HEMT according to the third embodiment of the invention, TlGaAs is used as a material of the electron transit layer. When TlGaAs and InGaAs, having identical band gap energies, are compared, the effective mass of electrons in TlGaAs is approximately equal to that of InGaAs. However, since the band gap energy of TlAs is smaller than that of InAs, the Tl composition ratio is smaller than the In composition ratio. So, the alloy ratio of Tl in TlGaAs is smaller than the alloy ratio of In in InGaAs, and alloy scattering of electrons in TlGaAs is less than that in InGaAs. That is, the p-HEMT employing a TlGaAs electron transit layer according to this third embodiment produces less alloy scattering in the electron transit layer as compared with the prior art p-HEMT employing an InGaAs electron transit layer, so that the electron mobility is improved.

Therefore, in the p-HEMT with the undoped $Tl_{0.13}Ga_{0.87}As$ electron transit layer 13 shown in FIG. 3, since the alloy ratio of the electron transit layer 13 is smaller than that of an $In_{0.26}Ga_{0.86}As$ electron transit layer having the same band gap energy as the electron transit layer 13, the alloy scattering of electrons is reduced and the electron mobility is increased, so that a high-frequency and low-noise p-HEMT is realized.

Furthermore, although an $In_{0.5}Ga_{0.5}As$ contact layer is employed in the prior art p-HEMT shown in FIG. 8, a $Tl_{0.4}Ga_{0.6}As$ contact layer is employed in the p-HEMT according to this third embodiment. As mentioned above, since Tl has a lattice constant approximately equal to that of In and a band gap energy smaller than that of In, the band gap energy can be reduced without an increase in the lattice mismatch. Therefore, the band gap energy of the contact layer can be reduced without roughening the surface, and the contact resistance of the ohmic electrode is reduced.

As described above, since the p-HEMT according to this third embodiment includes an GaAs substrate and the TlGaAs electron transit layer 13, the alloy ratio of the electron transit layer 13 can be made smaller than that of the InGaAs electron transit layer having the same band gap energy as the TlGaAs electron transit layer 13 in the prior art p-HEMT, whereby alloy scattering of electrons in the electron transit layer can be reduced, resulting in a p-HEMT with high electron mobility and low noise.

Further, since the p-HEMT includes the TlGaAs contact layer 16, the band gap energy of the contact layer is reduced without roughening the surface, whereby the contact resistance of the ohmic electrode is reduced.

Embodiment 4

Figure 4:
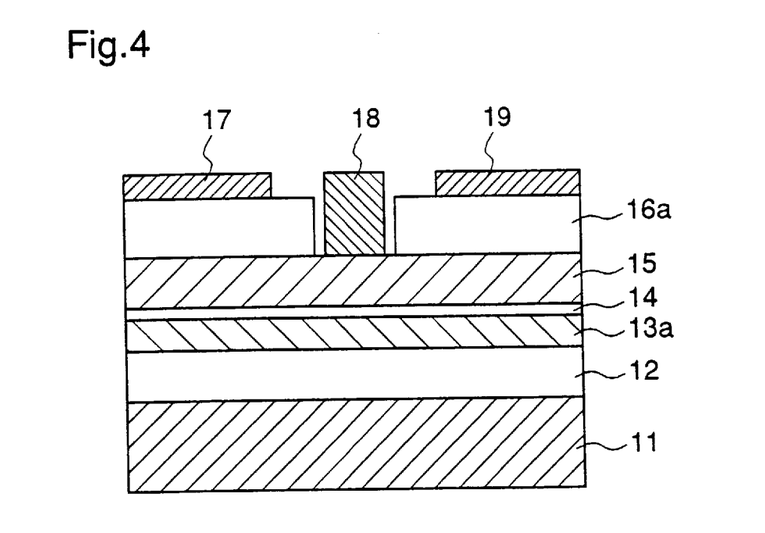
FIG. 4 is a cross-sectional view illustrating a p-HEMT according to a fourth embodiment of the present invention.

FIG. 4 is a cross-sectional view illustrating a p-HEMT employing a GaAs substrate, according to a fourth embodiment of the present invention. In this p-HEMT, strained TlGaAs is used as an electron transit layer, and the Tl composition of the TlGaAs electron transit layer is controlled to make the band gap energy of the TlGaAs electron transit layer smaller than the band gap energy of an InGaAs electron transit layer employed in the prior art p-HEMT and having the same thickness as the TlGaAs electron transit layer. In FIG. 4, the same reference numerals as those shown in FIG. 3 designate the same or corresponding parts. Reference numeral 13a designates an undoped $Tl_{0.2}Ga_{0.8}As$ electron transit layer about 12 nm thick, and numeral 16a designates an n+ type GaAs contact layer about 30 nm thick.

In this fourth embodiment, a TlGaAs layer is used as an electron transit layer. In the prior art HEMT using an InGaAs layer as an electron transit layer, it is not possible to reduce the band gap energy by increasing the In composition to 0.27 or more while maintaining the thickness of the electron transit layer at about 12 nm that is required to obtain a sufficient sheet electron density, because lattice mismatch dislocations occur. However, in the p-HEMT according to the fourth embodiment, it is possible to reduce the band gap energy, as compared with the InGaAs electron transit layer having the In composition of 0.27, by increasing the Tl composition of the TlGaAs electron transit layer 13a to 0.14 or more, without lattice mismatch dislocations, while maintaining the thickness of the electron transit layer at about 12 nm. For example, in the p-HEMT shown in FIG. 4, when the thickness of the TlGaAs electron transit layer 13a is 12 nm and the Tl composition is 0.2, the band gap energy of the electron transit layer 13a can be reduced while maintaining a sufficient thickness of the electron transit layer, whereby the effective mass of electrons is reduced.

As described above, according to the fourth embodiment of the invention, since the p-HEMT includes the GaAs substrate 11 and the TlGaAs electron transit layer 13a, the band gap energy of the electron transit layer 13a can be smaller than the band gap energy of the electron transit layer employed in the prior art p-HEMT and having the same thickness as the electron transit layer 13a, whereby the effective mass of electrons is reduced. As a result, a high-frequency and low-noise p-HEMT is realized.

Embodiment 5

Figure 5:
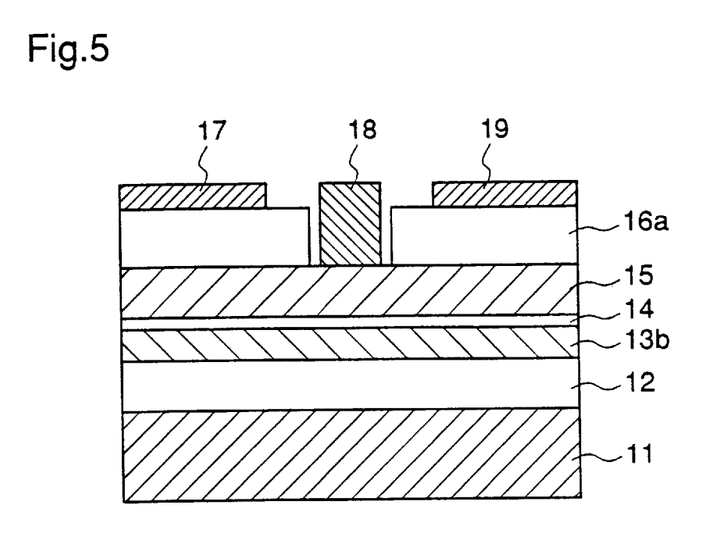
FIG. 5 is a cross-sectional view illustrating a p-HEMT according to a fifth embodiment of the present invention.

FIG. 5 is a cross-sectional view illustrating a p-HEMT employing a GaAs substrate, according to a fifth embodiment of the present invention. In this p-HEMT, strained TlGaAs is employed as an electron transit layer, and the thickness of the TlGaAs electron transit layer is thicker than the InGaAs electron transit layer employed in the prior art HEMT and has the same band gap energy as the TlGaAs electron transit layer. In FIG. 5, the same reference numerals as those shown in FIG. 3 designate the same or corresponding parts, and reference numeral 13b designates an undoped $Tl_{0.13}Ga_{0.87}As$ electron transit layer about 18 nm thick.

In the prior art p-HEMT using the InGaAs electron transit layer, it is difficult to increase the thickness of the electron transit layer while maintaining a desired band gap energy, because lattice mismatch dislocations occur. For example, it is very difficult to make the InGaAs electron transit layer thicker than 12 nm while maintaining an In composition of 0.26, because the electron transit layer exceeds the critical thickness. In this fifth embodiment, however, since the electron transit layer 13b comprises TlGaAs containing Tl that is larger than In in atomic number and approximately equal to In in covalent radius, the Tl composition required to obtain a desired band gap energy can be made smaller than the In composition in the InGaAs electron transit layer, so that the thickness of the TlGaAs electron transit layer 13b can be increased without lattice mismatch dislocations. For example, in FIG. 10, the material of the electron transit layer 13b according to this fifth embodiment, i.e., 18 nm thick $Tl_{0.13}Ga_{0.87}As$ (f=0.011), is shown by point (e), and this point (e) is below the critical point at which lattice mismatch dislocations occur. On the other hand, 18 nm thick $In_{0.26}Ga_{0.74}As$ having the same band gap energy as $Tl_{0.13}Ga_{0.87}As$ is shown by point (f) in FIG. 10, and this point (f) is above the critical point at which lattice mismatch dislocations occur. Therefore, in this fifth embodiment of the invention, it is possible to increase the thickness of the $Tl_{0.13}Ga_{0.87}As$ electron transit layer, a band gap energy of which is as low as that of the $In_{0.26}Ga_{0.86}As$ layer, to 12 $\mu$m or more.

As described above, since the p-HEMT according to the fifth embodiment includes the GaAs substrate 11 and the TlGaAs electron transit layer 13, the thickness of the electron transit layer 13 can be increased as compared with the prior art p-HEMT having an InGaAs electron transit layer, whereby the sheet electron density is increased, resulting in a high-frequency and high-power-out-put p-HEMT.

While in the third to fifth embodiments of the invention p-HEMTs each including a TlGaAs electron transit layer and a TlGaAs contact layer are described, the present invention may be applied to other semiconductor devices including TlGaAs layers with the same effects as provided by the third to fifth embodiments.

While in the third to fifth embodiments of the invention; p-HEMTs each including a TlGaAs electron transit layer and a TlGaAs contact layer are described, the present invention may be applied to a p-HEMT including, as an electron transit layer and a contact layer, Group III-V mixed crystal semiconductor layers that contain Tl and Ga as Group III elements and As as a Group V element, have a lattice constant larger than that of GaAs, and pseudomorphically lattice-match with GaAs, such as zinc-blende type III-V mixed crystal semiconductor layers, with the same effects as provided by the third to fifth embodiments. For example, strained $Al_{x1}Ga_{x2}In_{x3}Tl_{x4}AS_yP_{1-y}$ (x1+x2+x3+x4=1, $0 \leq x1 < 1, 0 < x2 < 1, 0 \leq x3 < 1, 0 < x4 < 1, 0 < y \leq 1$) layers may be employed as an electron transit layer and a contact layer. However, the thickness of the III-V mixed crystal semiconductor electron transit layer must be smaller than the critical thickness at which dislocations occur due to lattice mismatch with the GaAs substrate.

Embodiment 6

Figure 6:
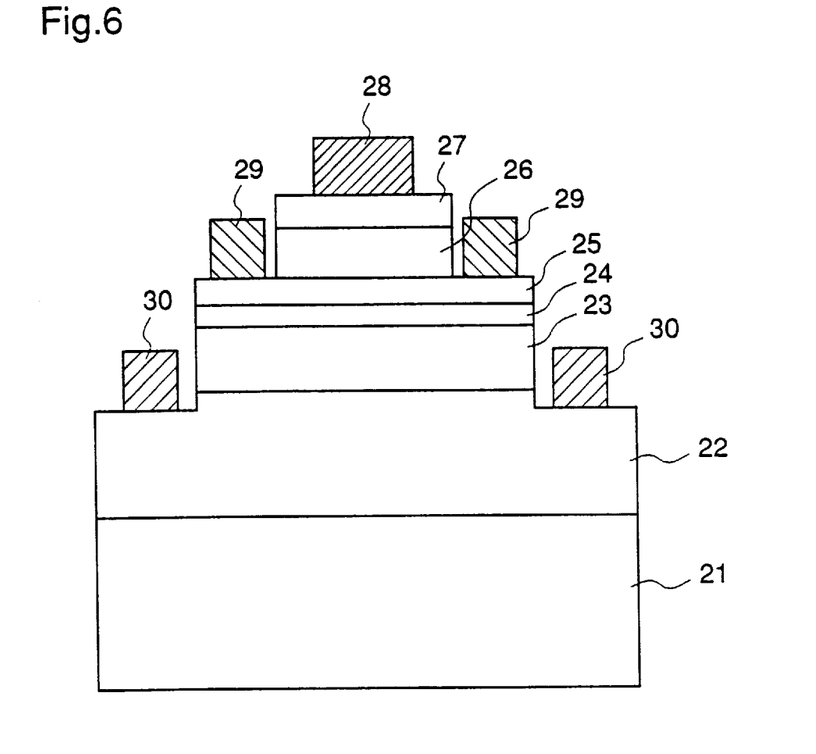
FIG. 6 is a cross-sectional view illustrating an HBT according to a sixth embodiment of the present invention.

FIG. 6 is a cross-sectional view illustrating a heterojunction bipolar transistor (hereinafter referred to as an HBT) including a strained base layer, according to a sixth embodiment of the present invention. In FIG. 6, reference numeral 21 designates a semi-insulating GaAs substrate. An n+ type GaAs collector contact layer 22 is disposed on the GaAs substrate 21. An n type GaAs first collector layer 23 is disposed on a center portion of the collector contact layer 22. Collector electrodes 30 are disposed on the collector contact layer 22 at opposite sides of the first collector layer 23. An n type $Tl_xGa_{1-x}As$ second collector layer 24 is disposed on the first collector layer 23. In the second collector layer 24, the Tl composition x is 0 at the interface with the collector contact layer 22 and continuously increases upward to 0.2. A p+ type $Tl_xGa_{1-x}As$ base layer 25 is disposed on the second collector layer 24. In the base layer 25, the Tl composition x is 0.2 at the interface with the second collector layer 24 and continuously decreases toward the emitter layer to 0. Although the Tl compositions x of the second collector layer 24 and the base layer 25 are varied within the range from 0 to 0.2, this range may be changed as desired. However, the Tl compositions must be identical at the interface between the base layer 23 and the second collector layer 25. An n type $Al_{0.3}Ga_{0.7}As$ emitter layer 26 is disposed on a center portion of the base layer 25. Base electrodes 29 are disposed on the base layer 25 at opposite sides of the emitter layer 26. An n+ type GaAs emitter contact layer 27 is disposed on the emitter layer 26. An emitter electrode 28 is disposed on the emitter contact layer 27. The fabrication process of this HBT comprises the steps of epitaxially growing the n+ type GaAs collector contact layer 22, the n type GaAs first collector layer 23, the n type $Tl_xGa_{1-x}As$ second collector layer 24, the p+ type $Tl_xGa_{1-x}As$ base layer 25, the n type $Al_{0.3}Ga_{0.7}As$ emitter layer 26, and the n+ type GaAs emitter contact layer 27 successively on the GaAs substrate 21, and producing the emitter electrode 28, the base electrodes 29, and the collector electrodes 30.

In the HBT according to this sixth embodiment, a TlGaAs layer in which the Tl composition continuously decreases toward the emitter is used as the base layer 25. In contrast to the prior art HBT including the InGaAs base layer 51 shown in FIG. 9, since the TlGaAs base layer 25 contains Tl which has a band gap energy smaller than that of In and a lattice constant approximately equal to that of In, the band gap energy of the base layer 25 on the collector side can be reduced without lattice mismatch dislocations even though the thickness of the base layer is not changed, whereby the potential gradient of the base layer is increased and the electron velocity in the base layer is increased, resulting in a reduction in the base transit time.

Further, since the thickness of the base layer can be increased without lattice mismatch dislocations while maintaining the potential gradient, the base resistance can be reduced as compared with the prior art HBT shown in FIG. 9.

As described above, according to the sixth embodiment of the invention, in the HBT employing the GaAs substrate 21, since the p+ type $Tl_xGa_{1-x}As$ base layer 25 in which the Tl composition x continuously decreases from the interface with the collector layer to the interface with the emitter layer, is employed, the potential gradient of the base layer 25 is increased and the electron velocity in the base layer 25 is increased, whereby the base transit time is reduced.

Furthermore, since the thickness of the base layer 25 can be increased without lattice mismatch dislocations while maintaining the potential gradient, the base resistance can be reduced.

In the HBT according to the sixth embodiment, the Tl composition x of the n type $Tl_xGa_{1-x}As$ second collector layer 24 continuously increases toward the base layer, and the Tl composition x of the p+ type $Tl_xGa_{1-x}As$ base layer 25 continuously decreases from the interface with the collector layer to the interface with the emitter layer. However, the Tl composition x of the second collector layer 24 may increase discontinuously, i.e., nonlinearly, as long as it increases toward the base layer. Likewise, the Tl composition x of the base layer 25 may decrease discontinuously, i.e., nonlinearly, as long as it decreases toward the emitter layer. Also in this case, the same effects as provided by the sixth embodiment are realized.

While in this sixth embodiment of the invention an HBT including a TlGaAs base layer and a TlGaAs second collector layer is described, the present invention may be applied to an HBT including, as a base layer and a second collector layer, III-V mixed crystal semiconductor layers that contain Tl and Ga as Group III elements and As as a Group V element, have a lattice constant larger than that of GaAs, and pseudomorphically lattice-match with GaAs, such as zinc-blende type III-V mixed crystal semiconductor layers, with the same effects as provided by the sixth embodiment. For example, strained $Al_{x1}Ga_{x2}In_{x3}Tl_{x4}As_yP_{1-y}$ (x1+x2+x3+x4=1, $0 \leq x1 < 1$, $0 < x2 < 1$, $0 \leq x3 < 1$, $0 < x4 < 1$, $0 < y \leq 1$) layers may be employed. However, the thicknesses of the III-V mixed crystal semiconductor layers must be smaller than the critical thickness at which dislocations occur due to lattice mismatch with the GaAs substrate.

In the HBT according to this sixth embodiment, the base layer 25 is p type, and the first collector layer 23, the second collector layer 24, and the emitter layer 26 are n type. However, the present invention may be applied to a similar HBT wherein the base layer 25 is n type and the first collector layer 23, the second collector layer 24, and the emitter layer 26 are p type, with the same effects as provided by the sixth embodiment.

In the HBT according to this sixth embodiment, the first collector layer 23, the second collector layer 24, the base layer 25, and the emitter layer 26 are successively disposed on the GaAs substrate 21. However, the present invention may be applied to a similar HBT wherein the emitter layer 26, the base layer 25, the second collector layer 24, and the first collector layer 23 are successively disposed on the GaAs substrate 21, with the same effects as provided by the sixth embodiment.

Furthermore, while in the sixth embodiment emphasis has been placed upon an HBT, other semiconductor devices including potential grading layers are within the scope of the present invention.

What is claimed is:

1. A semiconductor device comprising:
   a GaAs substrate having a first conductivity type and a lattice constant;
   a first conductivity type lower cladding layer disposed on the GaAs substrate;
   a TlGaAs active layer having a lattice constant larger than the lattice constant of the GaAs substrate and making a pseudomorphic lattice match with the GaAs substrate;
   an upper cladding layer of a second conductivity type, opposite the first conductivity type, disposed on the active layer; and
   a second conductivity type contact layer disposed on the upper cladding layer.

2. A semiconductor device comprising:

a semi-insulating GaAs substrate having a lattice constant a TlGaAs electronic transit layer disposed on the GaAs substrate, having a lattice constant larger than the lattice constant of the GaAs substrate, and making a pseudomorphic lattice match with the GaAs substrate;

a first conductivity type electron supply layer disposed on the electron transit layer;

a first conductivity type contact layer disposed on the electron supply layer, the contact layer having an opening exposing the electron supply layer;

a source electrode and a drain electrode disposed on the contact layer at opposite sides of the opening; and a gate electrode disposed on the electron supply layer in the opening.

3. A semiconductor device comprising:

a semi-insulating GaAs substrate having a lattice constant;

a first collector layer disposed on the GaAs substrate;

a TlGaAs second collector layer disposed on the first collector layer, having a lattice constant larger than the lattice constant of the GaAs substrate, making a pseudomorphic lattice match with the GaAs substrate, and having a Tl composition increasing with distance from the GaAs substrate to a maximum Tl composition;

a TlGaAs base layer disposed on the second collector layer, having a Tl composition decreasing from the maximum Tl composition of the second collector layer, with distance from the second collector layer, having a lattice constant larger than the lattice constant of the GaAs substrate, and making a pseudomorphic lattice match with the GaAs substrate; and an emitter layer disposed on the base layer.

4. A semiconductor device comprising:

a semi-insulating GaAs substrate having a lattice constant;

an emitter layer disposed on the GaAs substrate;

a TlGaAs base layer disposed on the emitter layer, having a lattice constant larger than the lattice constant of the GaAs substrate, making a pseudomorphic lattice match with the GaAs substrate, and having a Tl composition that increases with distance from the GaAs substrate to a maximum Tl composition:

a TlGaAs second collector layer disposed on the base layer, having a Tl composition decreasing from the maximum Tl composition of the base layer, with distance from the base layer, having a lattice constant larger than the lattice constant of the GaAs substrate, and making a pseudomorphic lattice match with the GaAs substrate; and a first collector layer disposed on the second collector layer.

* * * * *